United States Patent [19]

Kanda et al.

[11] Patent Number: 5,478,690
[45] Date of Patent: Dec. 26, 1995

[54] ALKALI DEVELOPABLE PHOTOSENSITIVE RESIN COMPOSITION COMPRISING A BINDER HAVING BETAINE SIDE GROUPS

[75] Inventors: Kazunori Kanda, Yao; Yoshifumi Ichinose, Ikeda; Seiji Arimatsu, Hirakata, all of Japan

[73] Assignee: Nippon Paint Co., Ltd., Osaka, Japan

[21] Appl. No.: 366,444

[22] Filed: Dec. 30, 1994

Related U.S. Application Data

[63] Continuation of Ser. No. 835,596, Feb. 14, 1992, abandoned.

[30] Foreign Application Priority Data

Feb. 14, 1991 [JP] Japan .................................. 3-020919

[51] Int. Cl.$^6$ ............................ G03F 7/021; G03F 7/023; G03F 7/033
[52] U.S. Cl. ......................... 430/175; 430/165; 430/176; 430/191; 430/192; 430/193; 430/280; 430/281; 430/283; 430/288; 430/302; 430/906; 430/910; 526/287; 526/288
[58] Field of Search ................................ 430/176, 175, 430/192, 281, 283, 288, 280, 191, 193, 906, 910, 165, 302; 526/287, 288

[56] References Cited

U.S. PATENT DOCUMENTS

| | | | |
|---|---|---|---|
| 3,411,912 | 11/1968 | Dykstra et al. | 526/287 |
| 3,493,547 | 2/1970 | Szita et al. | 526/286 |
| 3,497,482 | 2/1970 | Hwa | 526/287 |
| 3,671,502 | 6/1972 | Samour et al. | 526/287 |
| 4,207,109 | 6/1980 | Campbell et al. | 430/281 |
| 4,322,324 | 3/1982 | Mizuguchi et al. | 528/290 |
| 4,379,872 | 4/1983 | Ishikura et al. | 523/406 |
| 4,504,567 | 3/1985 | Yamamoto et al. | 430/165 |
| 4,574,110 | 3/1986 | Asano et al. | 526/288 |
| 4,614,701 | 9/1986 | Mori et al. | 430/197 |
| 4,749,762 | 6/1988 | Foss | 526/312 |
| 5,028,516 | 7/1991 | Mukunoki et al. | 430/434 |
| 5,080,998 | 1/1992 | Irving et al. | 430/193 |

FOREIGN PATENT DOCUMENTS

| | | |
|---|---|---|
| 3516387 | 7/1985 | Germany . |
| 1603700 | 5/1978 | United Kingdom . |

OTHER PUBLICATIONS

Patent Abstracts of Japan, vol. 6, No. 18 (P–100) (896) 2 Feb. 1982 & JP–A–56 142 528 (Mitsubishi Kasei Kogyo K K) 6 Nov. 1981 *Abstract*.

*Primary Examiner*—John S. Y. Chu
*Attorney, Agent, or Firm*—Wenderoth, Lind & Ponack

[57] ABSTRACT

Disclosed is an alkali developable photosensitive resin composition useful for an offset printing plate, which has excellent developability and provides long life of a developer. The photosensitive resin composition comprising:

(a) an alkali-soluble type binder resin,
(b) a photosensitive substance, and
(c) a dye;
said binder resin (a) having an ampho-ionic group represented by the formula:

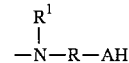

[wherein $R^1$ is H or a $C_{1-10}$ alkyl group which optionally has a substituent or a functional group in a chain, R is a substituted or non-substituted $C_{1-20}$ alkylene or phenylene group, and A is —COO or —$SO_3$]
and/or an ampho-ionic group represented by the formula:

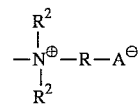

[wherein each $R^2$ is the same or different and respectively indicates a $C_{1-10}$ alkyl group which optionally has a substituent or a functional group in a chain, and R and A are as defined above] in a molecule and containing a resin having total acid value of 5 to 150.

8 Claims, No Drawings

ALKALI DEVELOPABLE PHOTOSENSITIVE RESIN COMPOSITION COMPRISING A BINDER HAVING BETAINE SIDE GROUPS

This application is a continuation of now abandoned application, Ser. No. 07/835,596, filed Feb. 14, 1992, now abandoned.

FIELD OF THE INVENTION

The present invention relates to an alkali developable photosensitive resin composition useful for an offset printing plate and the like. More particularly, it relates to an alkali developable photosensitive resin composition having excellent alkali developability, which provides longer life of an alkali developer, developability with a deteriorated (used) alkali developer and the like.

BACKGROUND OF THE INVENTION

In present printing industries, the percentage of an offset printing is extremely large. In general offset printing techniques, such a system is used, for example, the image area of the resin composition having a thickness of several microns becomes lipophilic to receive an ink and the aluminum substrate whose surface has been subjected to a hydrophilization treatment becomes the non-image area to receive a water, whereby, the printing object is printed.

In that case, some properties are requested for the resin layer which becomes the image area, that is, they are as follows:

(1) application property, storage stability on production;
(2) photosensitivity, developability, resolution, image distinguishability, long life of a developer on plate making;
(3) lipophilicity, durability, chemical resistance, adherence with a substrate on printing, etc.

Among them, developability and long life of a developer (i.e. even if the resin content in a developer becomes high by repeating developing operations, it's developability maintains the same quality as that obtained in the case of using a fresh developer) is considered to be important in view of practical use.

However, a conventional composition comprising an alkali-soluble type binder resin has a disadvantage that life of a developer is still insufficient and, therefore, a developer is deteriorated in a short period of time, which results in precipitation of the resin in the developer.

OBJECTS OF THE INVENTION

Under these circumstances, the present inventors have intensively studied. As a result, it has been found that the above problem can be solved by using an alkali-soluble type binder resin having excellent solubility and elusion property on development, which is hardly insolubilized in a developer, and the present invention has been completed.

That is, the main object of the present invention is to provide an alkali developable photosensitive resin composition for an offset printing plate, which has excellent developability, longer life of a developer, developability with a deteriorated (used) developer and the like.

This object as well as other objects and advantages of the present invention will become apparent to those skilled in the art from the following description.

SUMMARY OF THE INVENTION

According to the present invention, there is provided an alkali developable photosensitive resin composition comprising:

(a) an alkali-soluble type binder resin,
(b) a photosensitive substance, and
(c) a dye;

said binder resin (a) having an ampho-ionic group represented by the formula:

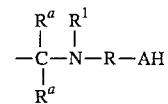

wherein each $R^a$ is the same or different and respectively indicates H, $CH_3$, $C_2H_6$ or $C_{5-8}$ alkyl group, $R^1$ is H or a $C_{1-20}$ alkyl group which optionally has a substituent or a functional group in a chain, R is a substituted or non-substituted $C_{1-20}$ alkylene or phenylene group and A is $-COO$ or $-SO_3$.

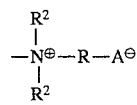

[wherein each $R^2$ is the same or different and respectively indicates a $C_{1-10}$ alkyl group which optionally has a substituent or a functional group in a chain, and R and A are as defined above] in a molecule and containing a resin having total acid value of 5 to 150.

DETAILED EXPLANATION OF THE INVENTION

The binder resin (a) having an ampho-ionic group in a molecule to be formulated in the photosensitive resin composition of the present invention is the resin which has excellent ink wettability and is easily developed with an alkali developer and, further, has continuous solubility in the developer. In addition, when the photosensitive resin composition is used as a positive type, a part of the binder resin (a) having an ampho-ionic group in a molecule may have a photo-degradation or photo-solubilizable type photosensitive group (e.g. t-butyloxycarbonyl group, o-naphthoquinone diazido group, etc.). When it is used as a negative type, the binder resin may have photopolymerizable type photosensitive group (e.g. acryloyl group, methacryloyl group, cinnamoyl group, etc.).

The binder resin (a) may also have an ionic or hydrophilic substituent such as carboxyl group, sulphonic group, phosphoric group, hydroxyl group, amino group and the like, and the combination with carboxyl group is most preferred. An amount of the above ampho-ionic group to be present [ampho-ionic group value, that is, represented by the amount of patassium hydroxide (mg) which is necessary to neutralize a resin (a) having 1 g of an ampho-ionic group] is 0.1 to 100, more preferably 1 to 50, most preferably 2 to 30. In addition, total acid value [that is, the sum of acid value derived from ampho-ionic group and that derived from other acid groups] of the binder resin (b) is 5 to 150. When the ampho-ionic group value is smaller than 0.1 and total acid value is smaller than 5, developability and long life of a developer are insufficient. When the ampho-ionic group value exceeds 100 or total acid value exceeds 150, alkali solubility becomes too large, whereby, remaining of hilight or fine line becomes inferior or film strength becomes lower, and it is not preferred. In the case that the binder resin having an ampho-ionic group is partly added, total acid value of the resin as a mixture is preferably 5 to 150.

The binder resin (a) may be selected from the group consisting of acryl resin, alkyd resin, polyester resin, modified epoxy resin, modified phenol resin, polyether resin, amino resin, melamine-formaldehyde resin and the like. Most preferably, acryl resin is used.

As the synthesis method of the binder resin (a) having an ampho-ionic group, for example, there can be used the followings:

(i) a method comprising copolymerizing a polymerizable monomer having an ampho-ionic group with other ethylenically unsaturated polymerizable monomer to obtain an oligomer- or polymer-like resin, (ii) a method comprising esterifying an ampho-ionic compound as a starting material by polycondensation reaction to obtain an oligomer- or polymer-like resin, (iii) a method comprising adding an ampho-ionic group by modifying a resin to obtain an oligomer- or polymer-like resin and the like.

In the above synthesis method (i), examples of the monomer having an ampho-ionic group include the compound represented by the formula:

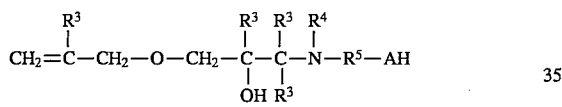

[wherein each $R^3$ is the same or different and respectively indicates H, $CH_3$ or $C_2H_6$, $R^4$ is H or a $C_{1-10}$ alkyl group which may contain —SO—, —COO— or —O— group in a molecule, $R^5$ is —OH, —SH, —SR$^6$ ($R^6$ is a $C_{2-4}$ alkyl group) or a $C_{1-10}$ alkylene group which may be substituted with at least one substituent of a $C_{2-9}$ alkyl group, and A is as defined above];

the compound represented by the formula:

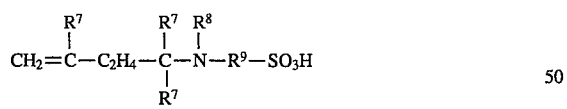

[wherein each $R^7$ is the same or different and respectively indicates H or a $C_{5-8}$ alkyl group, $R^8$ is H or a $C_{7-10}$ alkyl group which may contain —SO—, —COO— or —O— group in a molecule, or a group represented by the formula:

(wherein $R^7$ is as defined above), and $R^9$ is a $C_{1-10}$ alkylene group which may be substituted with at least one $C_{1-10}$ alkyl group];

the compound represented by the formula:

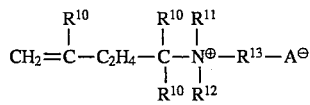

[wherein each $R^{10}$ is the same or different and respectively indicates H or $CH_3$, $R^{11}$ is a $C_{1-20}$ alkyl or cycloalkyl group which may have at least one hydroxyl group and have —O— or —COO— group in an alkyl skelton, $R^{12}$ is a $C_{1-20}$ alkyl or cycloalkyl group which may have at least one hydroxyl group and have —O— or —COO— group in an alkyl skelton or H, or $R^{11}$ and $R^{12}$ bond together with N atom to form a hetero ring, $R^{13}$ is a substituted or non-substituted alkylene group which is essentially represented by $(CH_2)_n$ (n is an integer of 1 to 6), and A is as defined above] and the like, as described in Japanese Patent Kokai Nos. 53-123899, 53-125996, 55-47651 and 55-47652. In addition to the above compounds, there can be used commercially available compounds such as N,N-dimethyl-N-methacryloxyethyl-N-(3-sulfopropyl)-ammonium-betaine,

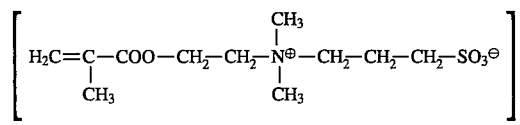

N,N-dimethyl-N-methacrylamidopropyl-N-(3-sulfopropyl)-ammonium-betaine,

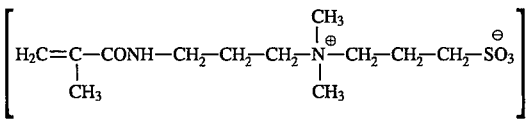

1-(3-sulfopropyl)-2-vinylpyridinium-betaine

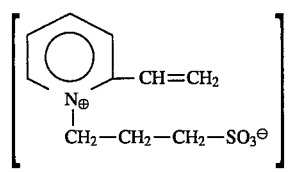

and the like (all of them are commercially available from RASCHIG AG.).

As the other ethylenic saturated monomer which is copolymerized with the above polymerizable monomer having an ampho-ionic group, the following monomers can be used:

(I) carboxyl group-containing monomer (e.g. acrylic acid, methacrylic acid, crotonic acid, itaconic acid, maleic acid, fumaric acid, etc.), (II) hydroxyl group-containing monomer (e.g. 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol, methallyl alcohol, etc.), (III) nitrogen-containing alkyl acrylate or methacrylate (e.g. dimethylaminoethyl acrylate, dimethylaminoethyl methacrylate, etc.), (IV) polymerizable amide (e.g. amide acrylate, amide methacrylate, N-methylolacrylamide, diacetone acrylamide, etc.), (V) polymerizable nitrile (e.g. acrylonitrile, methacrylonitrile, etc.), (VI) alkyl acrylate or methacrylate (e.g. methyl acrylate, methyl methacrylate, ethyl acrylate, n-butyl acrylate, isobutyl acrylate, n-butyl methacrylate, isopropyl methacrylate, 2-ethylhexyl acrylate, etc.), (VII) isocyanate group-containing monomer (meth)acryl isocyanate, isocyanateethyl methacrylate, etc.), (VIII) glycidyl(meth)acrylate, (IX) polymerizable aromatic compound (e.g. styrene, α-methylstyrene, vinyltoluene, t-butylstyrene, etc.), (X) α-olefin (e.g. ethylene, propylene, etc.), (XI) vinyl compound (e.g. vinyl acetate, vinyl propionate, etc. ), (XII) diene compound (e.g. butadiene, isoprene, etc. ) , (XIII) compound obtained by reacting a compound having a functional group which reacts with the above monomer (e.g. monomer produced by the reaction of hydroxyl group-containing monomer (II) with isocyanate compound, monomer produced by the reaction of carboxyl group-containing monomer (I) with glycidyl group-containing compound, etc.) and the like.

The polymerization initiator may be anyone that is known to art and examples thereof include peroxide initiator (e.g. cumene hydroxyperoxide, di-t-butylperoxide, azobisisobutyronitrile, benzoyl peroxide, t-butyl peracetate, persulfate, aqueous hydrogen peroxide, etc.), azo initiator, redox initiator and the like.

On polymerization, solvents (e.g. isopropanol, butanol, xylol, toluol, isophorone, etc.), thermal polymerization inhibitors (e.g. hydroquinone, methoquinone, etc.) and the like may be added.

Regarding the composition for polymerization reaction, it is preferred that the amount of the polymerizable monomer having an ampho-ionic group is 0.1 to 100 parts by weight and the amount of polymerization initiator is 0.01 to 5 parts by weight, based on 100 parts by weight of the other ethylenically unsaturated monomer.

The polymerization conditions may be appropriately selected, for example, polymerization is conducted by mixing the above ingredients with stirring at 50° to 180° C. for 0.5 to 30 hours.

Thereafter, the mixture was subjected to a normal aftertreatment to obtain a binder resin (a) having an ampho-ionic group.

In the above synthesis methods (ii) and (iii) of the binder resin (a), examples of a modified resin to be synthesized include modified alkyd resin, modified polyester resin, modified epoxy resin, modified acryl resin, modified melamine resin, modified polyether resin and the like. For example, in the synthesis method (i), modified alkyd resin and modified polyester resin may be prepared according to the method as described in Japanese Patent Application Nos. 54-110865 and 55-56048. That is, the preparation of alkyd resin and polyester resin are characterized in that continuous ester chain is formed by using polybasic acid and polyhydroxy alcohol as a requisite ingredient. In addition, by displacing a part of the polyhydroxy alcohol ingredient with the formula:

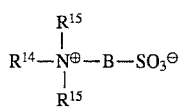

[wherein $R^{14}$ is an alkyl group having at least one hydroxyl group, each $R^{15}$ is the same or different and respectively indicates H or a substituted or non-substituted alkyl group, and B is a substituted or non-substituted $C_{1-5}$ alkylene or phenylene group], the above alkyd resin or polyester resin having an ampho-ionic group can be produced.

Examples of the resin to be synthesized in the synthesis method (iii) of the binder resin (a) include modified resin. It can be prepared according to the method as described in Japanese Patent Application No. 55-116293. That is, the epoxy resin is generally characterized in that it has the formula:

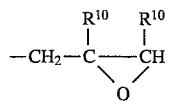

[wherein $R^{10}$ is as defined above] at a terminal. A ring is cleavaged by reacting with a compound of the formula:

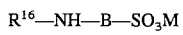

[wherein $R^{16}$ is an alkyl group which may have a substituent which does not reacts with an epoxy group, M is alkali metal ammonium group, and B is as defined above]

at a chain terminal group to obtain a modified epoxy resin wherein a part of the terminal group of said epoxy resin is converted into the formula:

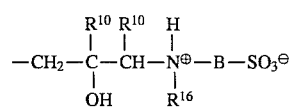

[wherein all substituents are as defined above] In proportion to an equivalent of the ampho-ionic group of the epoxy resin, hydrophilic nature of the modified epoxy resin is enhanced.

The modified melamine-formaldehyde resin can be prepared, for example, according to the method as described in Kyozo KITAOKA, "Elementary Synthetic Resin for Coating", May, 1974, pages 136 to 139. For example, it can be obtained by mixing three ingredients, that is, at least one sort which is selected from the group of hydroxyl group-containing aminesulfonic ampho-ionic compounds represented by the formula:

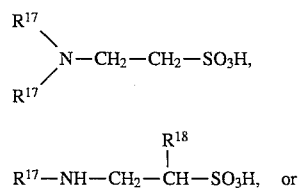

-continued

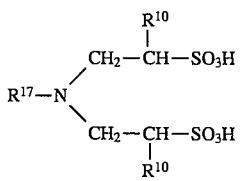

[wherein each $R^{17}$ is the same or different and respectively indicates a $C_{4-20}$ hydroxyalkyl group which may contain —O— or —COO— in an alkyl skelton, $R^{18}$ is a $C_{2-30}$ hydroxyalkyl or lower alkyl group which may contain —O— or —COO— in an alkyl skelton, and $R^{10}$ is as defined above], melamine and formalin according to a reaction condition and method which are normally employed in the conventional production of melamine.

The modified polyether resin can be prepared, for example, according to the method as described in Japanese Patent Application No. 55-116293. For example, an oxirane ring is cleavaged by reacting a polyether type epoxy resin of the formula:

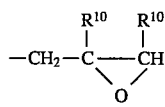

[wherein $R^{10}$ is as defined above]
with a compound of the formula:

$$R^{19}-NH-B-SO_3M$$

[wherein $R^{19}$ is a substituent which may have a substituent which does not reacts with an epoxy resin, and B and M are as defined above]

to obtain a modified polyether type epoxy resin wherein a part of the terminal group of said polyether type epoxy resin is converted into the formula:

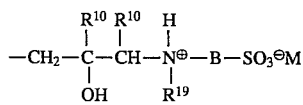

[wherein all substituents are as defined above]

In addition, the polyether type epoxy resin is known in the art. Various epoxy resins are commercially available and are obtained by reacting polyhydric alcohol or polyhydroxy alcohol other than bisphenol A with halohydrin.

In the present invention, if necessary, other binder resins may be appropriately used in combination, in addition to the above binder resin (a). As the other binder resin, for example, an alkali-soluble resin having no amphonic ionic group is preferred. Examples thereof include phenolic novolak resin, cresol novolak resin, phenol modified xylene resin, phenol modified xylenemethylene resin, polyhydroxystyrene, polyhalogenated hydroxystyrene, copolymer of (meth)acrylic acid with other vinyl compound (e.g. methyl methacrylate, etc.) and the like. Particularly, these resins are suitably used in a positive type alkali developable photosensitive resin composition. The alkali-soluble or alkali-insoluble resin selected from acryl resin, alkyd resin, polyester resin, modified epoxy resin, modified phenol resin, polyether resin, amino resin and the like can also be used.

The photosensitive substance (b) to be formulated in the photosensitive resin composition of the present invention enables to conduct photodecomposition and photopolymerization by exposure to control alkali solubility of a plate on development, which results in the formation of an image on a substrate. In the case that the photosensitive resin composition of the present invention is prepared as the negative type, it is preferred that the photosensitive substance (b) to be formulated is diazo resin. A condensate of an aromatic diazonium salt with an active carbonyl-containing compound (e.g. formaldehyde, etc.) which is a typical diazo resin is particularly useful. Examples of the preferred diazo resin include hexafluorophosphate salt, tetrafluoroborite salt and phosphate salt of a condensate of p-diazophenylamine with formaldehyde or acetaldehyde. Sulfonate salt (e.g. p-toluenesulfonate salt, dodecylbenzenesulfonate salt, 2-methoxy-4-hydroxy-5-benzoyl benzenesulfonate salt, etc.), phosphite salt (e.g. benzenephosphite salt, etc.), hydroxy group-containing compound salt (e.g. 2,4-dihydroxybenzophenone salt, etc.) and organic carbonate salt of a condensate of p-diazophenylamine with formaldehyde as as described in U.S. Pat. No. 3,300,309 are also preferred.

Furthermore, those obtained by condensing 3-methoxy-4-diazo-diphenylamine with 4,4-bis-methoxy-methyldiphenyl ether to form methylenesulfonate salt as described in Japanese Patent Kokai No. 58-27141 are also preferred.

In the case that the photosensitive resin composition of the present invention is prepared as the negative type, as the photosensitive substance (b) to be formulated, a photopolymerization initiation substance can also be used. The term "photopolymerizable composition" used herein means a mixture of a so-called photopolymerization initiator which forms an active radical when active rays such as ultraviolet rays are irradiated and a monomer having an ethylenically unsaturated group which is polymerized by the radical formed.

The photopolymerization initiator may be anyone that is known in the art and examples thereof include benzoin, benzoin alkyl ether (e.g. benzoin methyl ether, benzoin isopropyl ether, benzoin t-butyl ether, etc.), benzophenone, benzil, benzil dimethyl ketal and the like. Those which absorb a visible ray to form a radical by the interaction with a radical forming agent are also included. As the above compounds, combination of a sensitizer and radical forming agent is known, for example, it is disclosed in Japanese Patent Kokai No. 63-17903. As the compound of the sensitizer alone or that by combination of the sensitizer and radical forming agent, for example, there are eosin/amine, riboflavin, cyanine pigments, imide arylcarbonate (Japanese Patent Kokai No. 47-32819), compound having a trihalomethyl group which is conjugated with a triazine ring by ethylenic unsaturation (Japanese Patent Kokai No. 48-36281), triphenyl imidazolyl dimer (Japanese Patent Kokai No. 48-38403), arylthiomethyl benzophenone (Japanese Patent Kokai No. 48-67377), cobalt complex (Japanese Patent Kokai Nos. 50-10724 and 59-10731), unsaturated ketone conjugated with p-dialkylamino allylidene (Japanese Patent Kokai No. 54-155292), polycyclic quinone and tertiary amine (Japanese Patent Kokai No. 52-134692), porphine or metallic porphine and diaryl iodonium salt (Japanese Patent Kokai No. 60-78442), mixed system of xanthene or thioxanthene pigment and N-phenylglycine (Japanese Patent Kokai No. 62-143043), combination of a sensitizer (e.g. merocyanine pigment, aromatic conjugated ketone, acyl group-substituted coumarine, acridine derivative, etc.), o-acyloxime (e.g. 3-phenyl-5-isooxazoline, etc.), halide (e.g. 2,4,6-tris(trichrolomethyl)-1,3,5-triadine, etc.) and radical forming agent (e.g. 2-mercaptobenzoimidazol, etc.) (Journal of Japanese Chemical Society, 1984, 1, page 192).

As the photo-crosslinkable compound, for example, there are those wherein a side chain of PVA is modified with styrylquinolium, those having p-phenylenebis (α-cyanobutadienecarboxylic acid) as a photosensitive group and the like and they show good sensitivity even with high intensity and short-time exposure.

The amount of the above compound to be added is 0.01 to 40 parts by weight based on 100 parts by weight of the photosensitive liquid resin composition.

The monomer having an ethylenically unsaturated group to be combined may be anyone that is normally used and examples thereof include styrene, vinyltoluene, chrolostyrene, t-butylstyrene, α-methylstyrene, divinylbenzene, acrylic acid, methacrylic acid, methyl (meth)acrylate, ethyl (meth)acrylate, n-propyl (meth)acrylate, iso-propyl (meth)acrylate, n-butyl (meth)acrylate, iso-butyl (meth)acrylate, sec-butyl (meth)acrylate, t-butyl (meth)acrylate, 2-ethhylhexyl (meth)acrylate, n-nonyl (meth)acrylate, n-decyl (meth)acrylate, lauryl (meth)acrylate, n-tridecyl (meth)acrylate, stearyl (meth)acrylate, ethylene glycol mono(meth)acrylate, propylene glycol mono(meth)acrylate, diethylene glycol mono(meth)acrylate, dipropylene glycol mono(meth)acrylate, polyethylene glycol mono(meth)acrylate having a molecular weight of 200 to 1000, polypropylene glycol mono(meth)acrylate having a molecular weight of 200 to 1000, polyethylene glycol monomethyl ether mono(meth)acrylate having a molecular weight of 200 to 1000, polypropylene glycol monomethyl ether mono(meth)acrylate having a molecular weight of 200 to 1000, polyethylene glycol monoethyl ether mono(meth)acrylate having a molecular weight of 200 to 1000, polypropylene glycol monoethyl ether mono(meth)acrylate having a molecular weight of 200 to 1000, n-butoxyethyl (meth)acrylate, phenoxyethyl (meth)acrylate, 2-phenoxypropyl (meth)acrylate, cyclohexyl (meth)acrylate, tetrahydrofurfuryl (meth)acrylate, glycidyl (meth)acrylate, allyl (meth)acrylate, benzyl (meth)acrylate, tribromophenyl (meth)acrylate, 2,3-dichroloropropyl (meth)acrylate, 3-chrolo-2-hydroxypropyl (meth)acrylate, N,N-diethylaminoethyl (meth)acrylate, N,N-dimethylaminoethyl (meth)acrylate, N-t-butylaminoethyl (meth)acrylate, acrylamide, N,N-dimethylacrylamide, N,N-diethylacrylamide, ethylene glycol di(meth)acrylate, propylene glycol di(meth)acrylate, 1,3-propanediol di(meth)acrylate, 1,4-butanediol di(meth)acrylate, neopentyl glycol di(meth)acrylate, 1,6-hexanediol di(meth)acrylate, polyethylene glycol di(meth)acrylate, polypropylene glycol di(meth)acrylate, glycerine di(meth)acrylate, glycerine tri(meth)acrylate, trimethilolpropane tri(meth)acrylate, trimethylolethane tri(meth)acrylate, ethylene-bis-acrylamide, diallyl phthalate, triallyl cyanurate, diethyl fumarate, dibutyl fumarate, vinyl acetate and the like.

Further, the photosensitive resin composition of the present invention can be prepared as those of positive type. In that case, as the photosensitive substance (b), quinonediazide resin, particularly o-quinonediazide resin is preferred. As the o-quinonediazide resin, for example, ester of sulfonylchloride(e.g. o-benzoquinonediazide, o-naphthoquinonediazide, etc.) and aromatic mono or polyhydroxyl compound is useful. Typical examples include ester of benzoquinone-1,2-diazidesulfonylchloride or naphthoquinone-1,2-diazidesulfonylchloride and phenolnobolac resin or phenolnovolac resin, ester of naphthoquinone-1,2-diazidesulfonylchloride and pyrogallol acetone resin and the like.

Examples of other useful o-quinonediadize resin includeknown o-quinonediazide compounds such as ester of polydiacrylmethane polymer and quinonediazide sulfonate described in Japanese Patent Kokai No. 47-5303, ester of bisphenol-formaldehyde and o-quinonediazide sulfonylchloride described in Japanese Patent Kokai No. 48-63803, condensate of polymer amine and o-quinonediazide halide described in Japanese Patent Kokai No. 48-96575, reaction product of polymer product of styrene monomer and phenol derivative with o-quinonediazide sulfonate described in Japanese Patent Kokai No. 49-17481 and the like.

The dye (c) formulated as the image colorant may be a color material such as basic dye and oil-soluble dye, which gives good image contrast after exposure and therefore handling of the plate. Examples thereof include a basic dye such as Victoria Pure Blue BOH, Victoria Blue BH, Methyl Violet, Aizen Malachite Green (hereinabove, manufactured by Hodagaya Chemical K.K.), Patent Pure Blue VX, Rhodamine B, Methylene Blue (hereinabove, manufactured by Sumitomo Chemical Industries K.K.), etc. and an oil soluble dye such as Sudan Blue II, Victoria Blue F4R (hereinabove, manufactured by B.A.S.F), Oil Blue #603, Oil Blue BOS, Oil Blue IIN (hereinabove, manufactured by Orient Chemical Industries K.K.), etc.

The photosensitive resin composition of the present invention may further contain additives, if necessary, such as solvents, fillers, pigments, photo-degradatable acid generators, surfactants for improving application property, antifoaming agents and organic or inorganic microfillers. As the organic filler, for example, microgel (particle size of 0.01 to 5µ) of which inside is gelatinized is preferred. Particularly preferred example thereof include microgel having a particle size of 0.01 to 2µ prepared by emulsification polymerization using a polymeric emulsifier having Sp value of 9 to 16, as is disclosed in Japanese Patent Application No. 3-036029.

In the composition of the photosensitive resin composition of the present invention, effective amount of the binder resin containing an ampho-ionic ion group to be formulated varies depending on negative/diazo resin, negative/photopolymerizable composition and positive type resin as is shown below.

In-the negative/diazo resin, the amount of the binder resin containing an ampho-ionic group is 50 to 100% based on 100 parts by weight of the binder resin (a). When the amount is less than 50%, the above effects regarding developability can not be obtained. The amount of the photosensitive substance (b) is 5 to 15 parts by weight, preferably 6 to 12 parts by weight and the amount of the dye (c) is 0.1 to 5 parts by weight, preferably 0.2 to 4 parts by weight, based on 100 parts by weight of the binder (a). When the amount of the photosensitive resin is less than the lower limit, image is not sufficiently formed and print durability is inferior. When the amount exceeds the upper limit, sensitivity is deteriorated and developing property becomes inferior. When the amount of the dye is less than the lower limit, visibility of the image can not be obtained and, when the amount exceeds the upper limit, sensitivity is deteriorated.

In the negative/photopolymerizable composition, the amount of the binder resin containing an ampho-ionic group is 25 to 100% based on 100 parts by weight of the binder resin (a). When the amount is less than 25%, the above effect regarding developability can not be obtained. The amount of the photosensitive substance (b) is 20 to 200 parts by weight, preferably 50 to 150 parts by weight and the amount of the dye (c) is 0.1 to 5 parts by weight, preferably 0.2 to 4 parts by weight, based on 100 parts by weight of the binder resin (a). When the amount of the photosensitive substance is less than the lower limit, image is not sufficiently formed. When the amount exceeds the upper limit, the surface of the sensitized film becomes tacky and developability becomes inferior. When the amount of the dye is less than the lower limit, visibility of the image area can not be obtained and, when the amount exceeds the upper limit, sensitivity is deteriorated. In the positive type, the amount of the binder resin containing an ampho-ionic group is 5 to 50% based on 100 parts by weight of the binder resin (a). When the amount is too small, the above effect regarding developability can not be obtained. When the amount exceeds 50%, solubility increases and, therefore, no image is formed. The amount of the photosensitive substance (a) is 25 to 75 parts by weight, preferably 30 to 70 parts by weight and the amount of the dye (c) is 0.1 to 5 parts by weight, preferably 0.2 to 4 parts by weight, based on 100 parts by weiht of the binder resin (a). When the amount of the photosensitive substance is less than the lower limit, the image is not sufficiently formed and, when the amount exceeds the upper limit, sensitivity is deteriorated and developability becomes inferior. When the amount of the dye is less than the lower limit, visibility of the image can not be obtained and, when the amount exceeds the upper limit, sensitivity is deteriorated.

The photosensitive resin composition of the present invention may be prepared by art-known methods, e.g. mixing the above components with stirring mechanically under light screening.

By using the photosensitive resin composition, an offset printing plate can be made. As the method for making the offset printing plate, a conventional method may be used. Firstly, the photosensitive resin composition of the present invention may be coated on a suitable substrate. Examples of the substrate include paper, paper on which a plastic (e.g. polyethylene, polypropylene, polystyrene, etc.) is laminated, aluminum (containing aluminum alloy), plate of metal (e.g. zinc, copper, etc.). plastic film (e.g. cellulose diacetate, cellulose triacetate, cellulose propionate, cellulose acetate, cellulose methyl acetate, cellulose ethyl acetate, cellulose nitrate, polyethylene terephthalate, polyethylene, polystyrene, polypropylene, polycarbonate, polyvinyl acetal, etc.), paper or plastic film on which the above metal is laminated or deposited and the like. Among these substrates, an aluminum plate has excellent dimensional stability and is comparatively lightweight and inexpensive, and it is preferred. A composite sheet wherein an aluminum sheet is bound to a polyethylene terephthalate film as described in Japanese Patent Kokoku No. 48-18327 is also preferred.

It is preferred that the substrate having the surface of metal, particularly aluminum is subjected to a hydrophlization treatment.

The coating method is not specifically limited, for example, coating is conducted using a bar coater, followed by drying at 40° to 80° C. for 1 to 10 minutes. The amount of coating after drying is about 0.5 to 2.5 g/m². If necessary, the resin which is soluble in an alkali developer (e.g. polyvinyl alcohol, hydroxypropyl methylcellulose, etc.) can be further coated, followed by drying to provide an overcoat layer.

The dried coat thus obtained is covered with an image-bearing negative or positive film, exposed to light and then developed according to a normal method to obtain an offset printing plate. As the light source used for exposure, for example, there are carbon-arc lamp, mercury vapour lamp, xenon lamp, metal halide lamp, strobo, ultraviolet rays, ultraviolet-laser rays, visible-laser rays and the like. Developing is conducted using an alkali depeloper. As the alkalinizing agent formulated in the alkali developer, for example, there are inorganic alkalinizing agents (e.g. sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, ammonia, etc.) and organic amine compounds (e.g. monomethylamine, dimethylamine, trimethylamine, monoethylamine, diethylamine, triethylamine, monoisopropylamine, diisopropylamine, n-butylamines, monoethanolamine, diethanolamine, triethanolamine, monoisopropanolamine, diisopropanolamine, triisopropanolamine, ethyleneimine, ethylenediamine, pyridine, etc.). As the solvent for the alkalinizing agent, for example, there can be used a water (particularly, deionized water) and the like. If necessary, benzyl alcohol, phenyl cellosolve, ethyl cellosolve and the like are further used. The concentration of the alkalinizing agent may be appropriately selected.

The photosensitive resin composition of the present invention has excellent developability and provides longer life of an alkali developer and, therefore, it has also excellent developability with a deteriorated (used) developer. It is considered that these excellent properties attribute to a great solubility latitude of an ampho-ionic group existing in the binder resin (a) to the developer. Further, it is considered that the solubility latitude attributes to the following characteristics of the ampho-ionic group.

(1) Buffer effect of the ampho-ionic group: The effect is well known from the fact that the ampho-ionic substance is used as a buffer having buffer action.

(2) Intensity of ionic character of the ampho-ionic group:

(3) Ionic structure of the ampho-ionic group: An amino group part and an acid group part are liable to form an intramolecular counter ion structure in a molecule, or they are also liable to form an intramolecular counter ion structure between molecules.

Particularly, under the existence of the ampho-ionic group, the resin can be dissolved or eluted on development without a lot of counter cations and, further, the resin has stable solubility even if alkali ion intensity of a developer is substantially lowered because the alkali component of the developer is used for the counter cation of the eluted resin which is accumulated in the developer.

As described above, the photosensitive resin composition of the present invention has excellent developability to an alkali developer as well as ability of lengthening a life of a developer and, further, it has excellent developability with a deteriorated (used) developer. Therefore, when-the photosensitive resin composition of the present-invention is used for the production of an offset printing plate, the image area has excellent sharpness and an oleophilic substance (e.g. resin, etc.) is completely removed at the non-image area. Therefore, a sharp printed product having no scumming can be obtained.

The following Preparation Examples, Examples and Comparative Examples further illustrate the present invention in detail but are not to be construed to limit the scope thereof. In the Preparation Examples, Examples and Comparative Examples, all "parts" are by weight unless otherwise stated.

Preparation of binder resin

Preparation Examples 1 to 5

Methoxypropanol (100 parts) was placed in a 2 liter flask equipped with a stirrer, a nitrogen introducing tube, a thermometer, a tap funnel and a condenser, followed by heating at 90° C. Then, a mixed solution of each ingredient shown in Table 1 and azobisisobutyronitrile (AIBN, 1.9 parts) was added dropwise over 2 hours. After completion of the addition, methoxypropanol (50 parts) was added, and the mixture was maintained at 90° C. with stirring for 30 minutes. Then, a mixed solution of methoxypropanol (50 g) and AIBN (0.5 parts) was added dropwise over one hour, followed by stirring for 30 minutes to complete the reaction. The reaction mixed solution was introduced in a large amount of deionized water and the precipitate formed was filtered off. The precipitate was sufficiently washed with deionized water and dried with a vacuum drier to obtain an acrylic binder resin.

Properties of each binder resin thus obtained are shown in Table 1.

TABLE 1

| | Preparation Example No. | | | | |
|---|---|---|---|---|---|
| | 1 | 2 | 3 | 4 | 5 |
| Ingredients (parts) | | | | | |
| 2-Hydroxyethyl methacrylate | 46 | 20 | 25 | 50 | 46 |
| Acrylonitrile | 15 | — | 15 | 20 | 15 |
| Methyl metacrylate | — | 30 | 21.5 | — | — |
| i-Butyl metacrylate | 28.9 | — | — | 26 | 30.6 |
| n-Butyl acrylate | — | 27.5 | 25 | — | — |
| Styrene | — | 15 | 5 | — | — |
| SPP[1] | — | — | 5.5 | — | — |
| SPE[2] | 2.5 | 6 | — | 2.5 | — |
| Acrylic acid | — | — | — | 1.5 | — |
| Methacrylic acid | 7.6 | 1.5 | 3.0 | — | 8.4 |
| Properties | | | | | |
| Ampho-ionic group value | 5.0 | 12.1 | 10.6 | 5.0 | 0 |
| Total acid value | 54.6 | 21.9 | 30.2 | 16.7 | 54.6 |
| Hydroxyl group value | 198.5 | 86.3 | 107.9 | 215.8 | 198.5 |

[1] N,N-dimethyl-N-methacrylamidepropyl-N-(3-sulfopropyl)ammonium betain, Mn = 292
[2] N,N-dimethylN-methacryloxyethyl-N-(3-sulfopropyl)ammonium betain, Mn = 279

Preparation Example 6

Bishydroxyethyl taurine (134 parts), neopentyl glycol (130 parts), azelaic acid (236 parts), phthalic anhydride (186 parts) and xylene (27 parts) were placed in a 2 liter flask equipped with a stirrer, a nitrogen introducing tube, a thermometer, a condenser and a decanter, followed by heating. Water produced by the reaction was azeotroped with xylene to remove it. The mixture was heated to 190° C. over about 2 hours after the beginning of reflux and allowed to continue stirring and dehydration until an acid value corresponding to carboxylic acid becomes 145, followed by cooling to 140° C. Then, the temperature was maintained at 140° C. and "Cardula E 10 (versatic acid grycidyl ester, manufactured by Shell, Co.) (314 parts) was added dropwise, followed by stirring for 2 hours to complete the reaction. The polyester resin thus obtained had an ampho-ionic value of 59, a hydroxyl group value of 90 and an average Mn of 1054.

Preparation Example 7

Sodium salt of taurine (73.5 parts), ethylene glycol (100 parts) and ethylene glycol monomethylether (200 parts) were placed in the same equipment as that of Preparation Example 6, followed by heating to 120° C. with stirring. After the content becomes homogeneous dissolution state, a solution of Epicoat 1001 (diglycidyl ether type epoxy resin of bisphenol A, epoxy equivalent of 470, manufactured by Shell Chemical Co.) (470 parts) and ethylene glycol monomethylether (400 parts) was added dropwise over 2 hours, followed by heating with stirring for 20 hours to complete the reaction. According to the same manner as that described in Preparation Example 1, the reaction product was purified and dried to obtain 518 parts of a modified epoxy resin.

An amphoionic group value by KOH titration of this resin was 49.4 and sulfur content by fluorescent X-ray analysis thereof was 2.8%.

Preparation of photosensitive resin composition and lithographic printing plate

EXAMPLE 1

An aluminum plate was subjeted to graining, alkali etching, electrochemical grinding and anodizing treatments and further subjected to a hydrophilization treatment. Then, a photosensitive solution of the following composition was coated on the aluminum plate using a bar coater. The drying was conducted at 80° C. for 4 minutes. The dry coating weight was 2 g/m².

| Ingredients | Amount (parts) |
|---|---|
| Binder resin of Preparation Ex. 1 | 9.2 |
| Diazo resin | 0.8 |
| Victoria Pure Blue BOH | 0.25 |
| Methoxypropanol | 40.00 |
| Dimethylformamide | 49.75 |

Then, this photosensitive plate was exposed with a vacuum printer HVP-22H manufactured by Hamaguchi Seiwa Kogyo K.K. (3 Kw idlefin metal halide lamp manufactured by Eye graphics K.K.) through the negative film at a distance of 1.2 m for 1 minutes and 30 seconds. Then, the exposed plate was developed with a diluted solution (developer for negative plate of automatic processor/water =1:1) at a developing rate of 80 cm/min and coated with a diluted solution (gumming solution/water =1:1) to obtain a lithographic printing plate.

This printing plate was mounted on a small offset printer Hamadaster 700CDX (manufactured by Hamada Insatsuki Seisakusho K.K.) and a wood free paper was printed using a commercially avilable ink. As a result, 50,000 sheets of paper were satisfactorily printed without scumming the non-printing area.

By using the photosensitive plate which was exposed again through the negative plate according to the same manner as that described above, a developer was diluted under the following conditions to evaluate the developing ability of an alkali-soluble binder resin.

TABLE 2

| | Developing ability of diluted developer[1] | | |
|---|---|---|---|
| Dilution ratio | Photosensitive plate of Ex. 1 | Photosensitive plate of Ex. 2 | Photosensitive plate of Com. Ex. 1 |
| Developer for negative plate/ water = | | | |
| 1/1 | A | A | A |
| 1/8 | A | A | B |
| 1/12 | B | B | C |

[1] A: satisfactorily developed
B: non-developed part is partly remained
C: not developed As is apparent from the above results, the photosensitive plate prepared from the composition of the present invention showed excellent developability even in a highly-diluted developer having poor developability. Further, a deteriorated (used) developer corresponding to that in which 20 g of a photosensitive resin composition was dissolved in 1 liter of a diluted developer (conc. developer/water =1/1) by development was prepared.

According to the same manner as that described above, the exposed printings material of this example was developed with this deteriorated developer. The resluts are shown in Table 3.

TABLE 3

| | Printing plate of Ex. 1 | Printing plate of Ex. 2 | Printing plate of Com. Ex. 1 |
|---|---|---|---|
| Developing ability[1] in deteriorated developer | A | A | B |

[1] A: satisfactorily developed
B: non-developed part is partly remained

Comparative Example 1

According to the same manner as that described above, a photosensitive composition containing no ampho-ionic group was evaluated using the binder resin of Preparation Example 5. In a printing test, 50,000 sheets of paper could be printed, however, developability in a diluted developer or deteriorated developer was inferior.

EXAMPLE 2

According to the same manner as that described in Example 1 except for using 1.5 parts of a polyester resin having an ampho-ionic group obtained in Preparation Example 5 and 7.7 parts of a resin obtained in Preparation Example 5 instead of 9.2 parts of a binder resin of Preparation Example 1, a photosensitive plate was obtained.

After the photosentive plate was exposed according to the same manner as that described in Example 1, developability in a diluted developer and deteriorated developer was evaluated and printing test of 50,000 sheets of paper was conducted. Good results were obtained in both tests.

EXAMPLE 3

| Ingredients | Amount (parts) |
|---|---|
| Cresol-formaldehyde novolak resin | 5.70 |
| Esterified product of naphthoquinone-1,2-diazide-5-sulfonylchloride and pyrogallol-acetone resin (described in Example 1 of the specification of U.S. Pat. No. 3,635,709) | 3.80 |
| Binder resin prepared in Preparation Example 2 | 0.50 |
| Victoria Pure Blue BOH | 0.10 |
| Photochromic dye | 0.10 |
| Methoxypropanol | 85.50 |

A photosensitive resin composition obtained by mixing the above ingredients was coated on an aluminum substrate which had been subjected to the same hydrophilization treatment as that of Example 1 using a bar coater so that the coating weight after drying became 2 g/m$^2$, followed by drying at 80° C. for 4 minutes Then, this photosensitive plate was exposed with a vacuum printer HVP-22H manufactured by Hamaguchi Seiwa Kogyo K.K. (3 kW metal halide lamp manufactured by Eye graphics K.K.) through the negative film at a distance of 1.2 m for 1 minutes and 30 seconds. Then, by using a automatic processor MPD-306-G manufactured by Dainippon Screen K.K., the exposed plate was developed with a diluted solution (developer for positive plate/water =1:8) at a developing rate of 80 cm/min and coated with a diluted solution (gumming solution/water =1:1) to obtain a lithographic printing plate.

By using this printing plate, printing test was conducted according to the same manner as that described in Example 1. As a result, it was confirmed that 30,000 sheets of paper can be printed. By using the resulting photosensitive plate, developability in a diluted developer and deteriorated developer was evaluated according to the same manner as that described in Example 1. Good results were obtained in both test.

TABLE 4

| Diluted developer | Photosensitive plate of Ex. 3 | Photosensitive plate of Ex. 4 | Photosensitive plate of Com. Ex. 2 |
|---|---|---|---|
| Developer for positive plate/ water = | | | |
| 1/8 | A | A | A |
| 1/16 | A | A | B |
| 1/20 | B | B | B–C |

[1] A: satisfactorily developed
B: non-developed part is partly remained
C: not developed

TABLE 5

| | Printing plate of Ex. 3 | Printing plate of Ex. 4 | Printing plate of Com. Ex. 2 |
|---|---|---|---|
| Developing[1] ability in | A | A | B |

TABLE 5-continued

| | Printing plate of Ex. 3 | Printing plate of Ex. 4 | Printing plate of Com. Ex. 2 |
|---|---|---|---|
| deteriorated developer | | | |

[1] A deteriorated developer corresponding to that in which 15 g of a photosensitive resin composition was dissolved in 1 liter of a dilated developer (conc. developer/water = 1/8) by development was prepared.

EXAMPLE 4

According to the same manner as that described in Example 3 except for using the binder resin obtained in Preparation Example as a binder resin, a photosensitive resin was obtained. The resulting photosensitive plate was evaluated according to the same manner as that described in Example 3. As a result, it could be confirmed that the photosensitive resin has good developability and printability.

Comparative Example 2

According to the same manner as that described in Example 3 except for using the binder resin having an ampho-ionic group of Preparation Example 2, a photosensitive resin was obtained. Regarding the resulting photosensitive plate, developability was tested according to the same manner as that described above.

EXAMPLE 5

| Ingredients | Amount (parts) |
|---|---|
| Cresol-formaldehyde novolak resin | 3.80 |
| Styrene-vinylphenol copolymer (styrene content of 85%) | 1.9 |
| Esterified product of naphthoquinone-1,2-diazide-5-sulfonylchloride and pyrogallol-acetone resin (described in Example 1 of the specification of U.S. Pat. No. 3,635,709) | 3.80 |
| Binder resin prepared in Preparation Example 3 | 0.45 |
| Victoria Pure Blue BOH | 0.10 |
| Photochromic dye | 0.10 |
| Methoxypropanol | 85.50 |

A photosensitive resin composition obtained by mixing the above ingredients was coated on an aluminum substrate which has been subjected to the same hydrophilization treatment as that of Example 1 using a bar coater so that the coating weight after drying became 2 g/m², followed by drying at 80° C. for 4 minutes.

Then, this photosensitive plate was exposed with a vacuum printer HVP-22H manufactured by Hamaguchi Seiwa Kogyo K.K. (3 kW metal halide lamp manufactured by Eye graphics K.K.) through a negative film at a distance of 1.2 m for 1 minutes and 30 seconds. Then, by using a automatic processor MPD-306-G manufactured by Dainippon Screen K.K., the exposed plate was developed with a diluted solution (developer for positive plate/water =1:8) at a developing rate of 80 cm/min and coated with a diluted solution (gumming solution/water =1:1) to obtain a lithographic printing plate. The photosensitive plate had a good developability.

EXAMPLE 6

| Ingrdeients | Amount (parts) |
|---|---|
| Binder resin of Preparation Example 4 | 2.04 |
| Styrene-maleic acid half ester[1] | 1.14 |
| Urethane oligomer | 2.04 |
| Pentaerythritol triacrylate | 3.60 |
| Polymerization inhibitor | 0.12 |
| Initiation substance[2] | 0.84 |
| Methyl cellosolve | 19.34 |
| Ethanol | 19.34 |
| Methyl ethyl ketone | 46.74 |

[1] resin having a molecular weight of 20,000 and an acid value of 185, "Scripset 540" manufactured by Monsanto Co.
[2] N-phenylglycine/3,3'-carbonylbis(7-diethylaminocoumarin) = 0.28/0.56

The photosensitive resin composition by mixing the above ingredients was coated on an aluminum substarate which had been subjected to a hydrophilization treatment using a bar coater so that the coating weight became 2 g/m² after drying, followed by drying at 60° C. for 4 minutes. By using a bar coater, 5% polyvinyl alcohol (degree of saponification of 88%, degree of polymerization of 500) was coated on this photosensitive layer so that the coating weight became 2 g/m² after drying, followed by drying at 60° C. for 5 minutes to form an overcoat layer.

The above dried plate was irradiated to 490 nm (light intensity of 4.4 mW/cm²), which was derived from a Xenone lamp (150 W, manufactured by Ushio Denki K.K.) through Toshiba KL-49 filter, through a negative film. Then, it was developed by a commercially available positive PS plate developer and coated with a solution (gumming solution/water =1:1) to obtain a lithographic printing plate.

The resulting printing plate had good printing properties. Further, the photosensitive plate had good developability.

EXAMPLE 7

According to the same manner as that described in Example 1 except that 2.1 g of a microgel solution prepared in Preparation Example 1 shown in Japanese Patent Application No. 3-036029 was further adddded to the formulation prepared in Example 1, evaluation was conducted. The same result as that of Example 1 was obtained. A photosensitive composition of this example was particularly superior in durability.

What is claimed is:

1. An alkali developable photosensitive resin composition comprising an admixture of:

(a) an alkali-soluble binder resin, (b) a photosensitive substance selected from the group consisting of diazo resins, quinonediazide compounds, quinonediazide resins and photopolymerizable compositions, and (c) a dye;

said binder resin (a) having an ampho-ionic group represented by the formula:

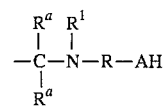

wherein each $R^a$ is the same or different and respectively indicates H, $CH_3$, $C_2H_6$ or a $C_{5-8}$ alkyl group, $R^1$ is H or a $C_{1-20}$ alkyl group which optionally has a substituent or a functional group in a chain, R is a phenylene group or a substituted or non-substituted $C_{1-20}$ alkylene group and A is —COO— or —$SO_3$; and/or an ampho-ionic group represented by the formula:

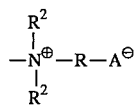

wherein each $R^2$ is the same or different and respectively indicates a $C_{1-10}$ alkyl group which optionally has a substituent or a functional group in a chain, and R and A are as defined above in a molecule and containing a resin having a total acid value of 5 to 150.

2. The alkali developable photosensitive resin composition according to claim 1, wherein said photosensitive substance (b) is a diazo resin.

3. The alkali developable photosensitive resin composition according to claim 1, wherein said photosensitive substance (b) is a photopolymerizable composition comprising a photopolymerization-initiator and a monomer having ethylenically unsaturated groups therein.

4. The alkali developable photosensitive resin composition according to claim 1, wherein said photosensitive substance (b) is a quinonediazide compound or resin.

5. The alkali developable photosensitive resin composition according to any of claim 1 which is used for an offset printing plate.

6. The alkali developable photosensitive resin composition according to claim 2 which is used for an offset printing plate.

7. The alkali developable photosensitive resin composition according to claim 3 which is used for an offset printing plate.

8. The alkali developable photosensitive resin composition according to claim 4 which is used for an offset printing plate.

* * * * *